(12) United States Patent
Murugesan et al.

(10) Patent No.: US 8,791,753 B2
(45) Date of Patent: Jul. 29, 2014

(54) SLEW RATE AND BANDWIDTH ENHANCEMENT IN RESET

(75) Inventors: Saravanan Murugesan, Bangalore (IN); Paul Walsh, Blackrock (IE); Gerard Baldwin, Cork (IE); Kaveh Hosseini, Rochestown (IE)

(73) Assignee: Cypress Semiconductor Corporation, San Jose, CA (US)

( * ) Notice: Subject to any disclaimer, the term of this patent is extended or adjusted under 35 U.S.C. 154(b) by 39 days.

(21) Appl. No.: 13/591,136

(22) Filed: Aug. 21, 2012

(65) Prior Publication Data
US 2013/0278334 A1 Oct. 24, 2013

(30) Foreign Application Priority Data
Apr. 18, 2012 (IN) .............. 1202/DEL/2012

(51) Int. Cl.
*H03F 1/02* (2006.01)
*G06F 7/64* (2006.01)
*G01R 27/26* (2006.01)
(52) U.S. Cl.
USPC ............... 330/9; 330/302; 327/336; 324/686
(58) Field of Classification Search
CPC ............ H03F 1/02; G06F 7/64; G01R 27/26
USPC ................. 330/9, 302; 327/336; 324/686
See application file for complete search history.

(56) References Cited

U.S. PATENT DOCUMENTS

| | | | |
|---|---|---|---|
| 3,868,580 A | 2/1975 | Battjes | |
| 4,651,032 A * | 3/1987 | Nobuta | 327/341 |
| 6,140,871 A | 10/2000 | Taft | |
| 6,538,591 B2 | 3/2003 | Sato et al. | |
| 6,891,414 B1 * | 5/2005 | Bunch et al. | 327/156 |
| 7,482,843 B2 | 1/2009 | Tsuchi et al. | |
| 7,557,648 B2 | 7/2009 | Okuyama | |
| 7,893,767 B2 | 2/2011 | Okuyama | |
| 7,936,299 B2 | 5/2011 | Astley et al. | |
| 8,018,238 B2 | 9/2011 | Cormier | |
| 8,299,844 B2 * | 10/2012 | Garverick et al. | 327/513 |
| 8,624,870 B2 * | 1/2014 | Joharapurkar et al. | 345/174 |
| 2010/0102831 A1 | 4/2010 | Kuang | |
| 2010/0134438 A1 | 6/2010 | Yu et al. | |

(Continued)

FOREIGN PATENT DOCUMENTS

| WO | 2005008776 A | 1/2005 |
|---|---|---|
| WO | WO2010033078 | 3/2010 |

OTHER PUBLICATIONS

Yeong-Shin Jang, A Charge Transfer Scheme based on Differential Driving for Capacitive Touch Sensors, KAIST Conferences, 2011, KAIST 373-1 Guseong-dong, Republic of Korea.

(Continued)

*Primary Examiner* — Patricia Nguyen (57) ABSTRACT

Embodiments of a capacitance sensing system including an integrating amplifier and methods for operating the same to provide a higher slew rate and bandwidth are described. In one embodiment, the integrating amplifier comprises an input stage including an inverting input coupled to an electrode of a capacitor to sense a capacitance and a non-inverting input coupled to a reference potential, and an output stage including a compensating capacitor coupled to an output. The compensating capacitor comprises two smaller capacitors coupled in parallel and a switching element configured to open when the integrating amplifier is operated in a RESET mode decoupling one of the two smaller capacitors from the output to decrease capacitance of the compensating capacitor.

20 Claims, 6 Drawing Sheets

(56) References Cited

U.S. PATENT DOCUMENTS

2011/0242050 A1   10/2011  Byun et al.
2012/0062244 A1*  3/2012  Santana et al. ................ 324/658
2012/0206154 A1    8/2012  Pant et al.

OTHER PUBLICATIONS

Gabriel.A. Rincon-Mora, Active Capacitor Multiplier in Miller-Compensated Circuits, IEEE J. Solid-State Circuits, vol. 35, Issue 1, pp. 26-32, Jan. 2000.

Xiahong Peng, Transconductance with capacitances feedback compensation for multistage amplifiers, IEEE J. Solid-State Circuits, vol. 40, Issue: 7, pp. 1514-1520, Jul. 2005.

International Search Report for International Application No. PCT/US2012/052715 dated Nov. 13, 2012; 2 pages.

Written Opinion of the International Searching Authority for International Application No. PCT/US2012/052715 mailed Nov. 13, 2012; 8 pages.

* cited by examiner

SLEW RATE AND BANDWIDTH ENHANCEMENT IN RESET

RELATED APPLICATIONS

This application claims priority to Indian Patent Application No. 1202/DEL/2012, filed Apr. 18, 2012, which application is hereby incorporated by reference in its entirety.

TECHNICAL FIELD

The present disclosure relates generally to circuits and methods for sensing capacitance, and more particularly to sensing and measuring circuits and methods for use with capacitive touchscreens.

BACKGROUND

Touchscreens are widely used in devices, such as personal computers, tablet computers, entertainment systems, game consoles, and cellular telephones for data input and/or controlling cursor movement. One common type of touchscreen uses a capacitive sensing system, to sense and measure proximity, position, displacement or acceleration of an object, such as a finger or stylus. The capacitive sensing system generally may include a matrix or array formed by etching parallel layers of conductive material separated by a layer of insulating material to form lines of receive and transmit electrodes with a sensing capacitor at each intersection of the receive and transmit electrodes. A voltage pulse (Tx) is applied to a transmit electrodes and the accumulated charge on each receive electrode or channel sensed and measured to detect a change in capacitance due to proximity of a conductor, such as a finger, to the touchscreen.

One way to sense a capacitance is to convert it to charge and measure the charge quantity. Charge and capacitance are related by Q=CV where Q=charge, C=capacitance and V=voltage. These capacitance sense solutions convert the capacitance into charge by modulating the voltage across it and integrating the resulting current. One conventional capacitance sensing system uses two parallel integration capacitors in feedback with a switched capacitor (SC) integrator. One capacitor is always integrating while the second can be reset in parallel. Thus, each receive (RX) channel may include two relatively large capacitors. This results in increased circuit complexity, cost and, more important, increased circuit size.

BRIEF DESCRIPTION OF THE DRAWINGS

The present invention will be understood more fully from the detailed description that follows and from the accompanying drawings and the appended claims provided below, where:

DETAILED DESCRIPTION

Figure 1:
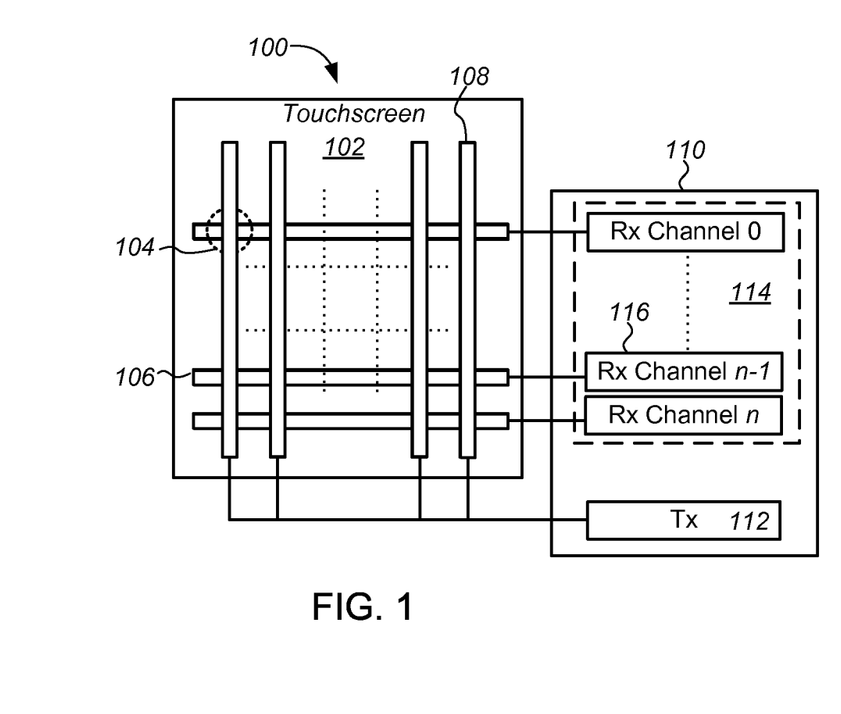
FIG. 1 is a schematic block diagram of a touchscreen.

FIG. 1 shows a touchscreen for which a capacitance sensing system including an integrating amplifier with a high slew rate and bandwidth in RESET mode is particularly useful. Referring to FIG. 1, in one embodiment, the touchscreen 100 may include a matrix or capacitive sensor array 102 of capacitive sensor elements or sense capacitors 104, each formed from an intersection of one of a plurality of receive electrodes 106 and transmit electrodes 108. The sensor array 102 is coupled to a controller 110, typically embodied in a separate, distinct integrated circuit (IC). The controller 110 may include a capacitive drive circuit or system 112 electrically coupled to each of the transmit electrodes 108, and a capacitance sensing system 114 electrically coupled to each of the receive electrodes 106. The capacitance sensing system 114 may include a plurality of substantially identical receive (Rx) channels 116, each coupled to one of the plurality of receive electrodes 106. Among embodiments, the controller 110 further may include one or more counters or timers to measure a length of time over which capacitance is integrated, and processing logic implemented in software or hardware to convert sensed capacitance values into data representing a position, displacement or acceleration of a conductive object, such as a finger or stylus, in proximity to the touchscreen 100.

To sense and measure capacitance or a change in capacitance of the sense capacitors 104, in one embodiment a voltage pulse (Tx) is applied sequentially to each of the transmit electrodes 108 resulting in an accumulation of charge on the receive electrodes 106, which is sensed and measured by the Rx channels 116, each coupled to one of the plurality of receive electrodes 106. By comparing any changes in sensed capacitance on several of the Rx channels 116, the controller 110 is able to generate data representing a position, displacement or acceleration of a finger relative to the touchscreen 100.

Figure 2:
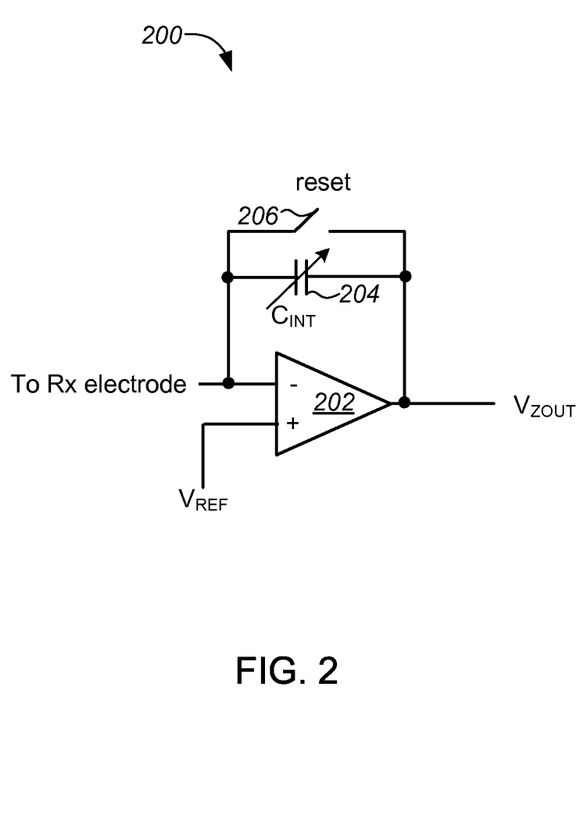
FIG. 2 is a schematic block diagram illustrating an integrating amplifier for converting a sensed capacitance to charge and measuring the charge quantity in a single receive channel.

A schematic block diagram of a single Rx channel 200 is illustrated in FIG. 2. Referring to FIG. 2, in one embodiment the Rx channel 200 may include an integrating amplifier 202, such as an integrator operational transconductance amplifier (OTA), having an inverting input coupled to a receive electrode of a capacitor for which capacitance is to be sensed, a non-inverting input coupled to a reference voltage ($V_{REF}$), and an output ($V_{ZOUT}$). The Rx channel 200 further may include a feedback or integration capacitor ($C_{INT}$) 204 coupled between the inverting input of the integrating amplifier 202 and the output to accumulate charge from the sense capacitor. In integration mode, according to one embodiment, as the $C_{INT}$ 204 charges $V_{ZOUT}$ increases until the integrating amplifier 202 is driven into saturation or is reset. A switch 206 coupled in parallel with the integration capacitor 204 may be configured to be open when the integrating amplifier 202 is operated in integration mode and closed when the integrating amplifier is operated in RESET mode to reset the capacitor.

Figure 3:
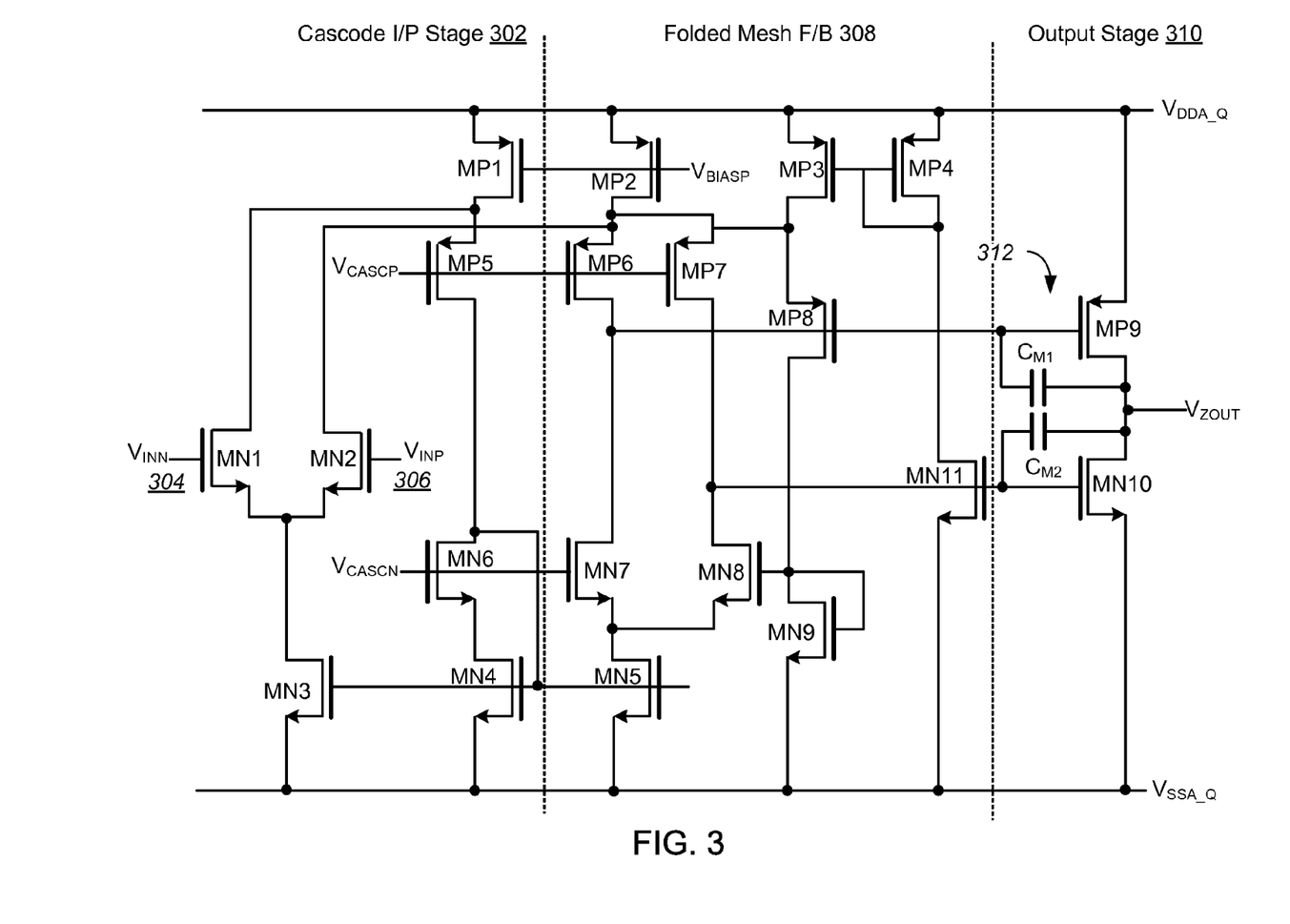
FIG. 3 is a schematic diagram of an embodiment of the integrating amplifier.

A schematic block diagram of the integrating amplifier is illustrated in FIG. 3. Referring to FIG. 3, in one embodiment the integrating amplifier may include a cascode input stage 302 including an inverting input ($V_{INN}$) 304 coupled to an electrode of a sense capacitor to sense a capacitance thereof and a non-inverting input ($V_{INP}$) 306 coupled to a reference potential, a folded mesh feed back stage 308, and an output stage 310 including one or more Miller or compensating capacitors (CM1 and CM2) 312 coupled to an output ($V_{ZOUT}$).

In one embodiment the slew rate of the integrating amplifier is determined by the drain current (ID) of MN3 divided by the compensating capacitance (CM1+CM2); while the bandwidth of the integrating amplifier is proportional to the transconductance of the first, input stage (GM1) divided by the compensating capacitance (CM1+CM2). Hence decreasing the compensating capacitor in reset mode gives an increase in both slew rate and gain bandwidth product (GBW).

However, decreasing the compensating capacitor can also lower the phase margin and cause instability in the integrating amplifier in RESET mode as the unity-gain-bandwidth (UGB) is pushed closer to the second pole which is given by GMN10+GMP9/CL. Increasing the output stage current will increase the GMN10+GMP9 and hence push the second pole still farther from the UGB and increasing stability. Generally, the output stage current is increased from about 150 uA to about 300 uA, or from 1.5 to 2 times.

Figure 4:
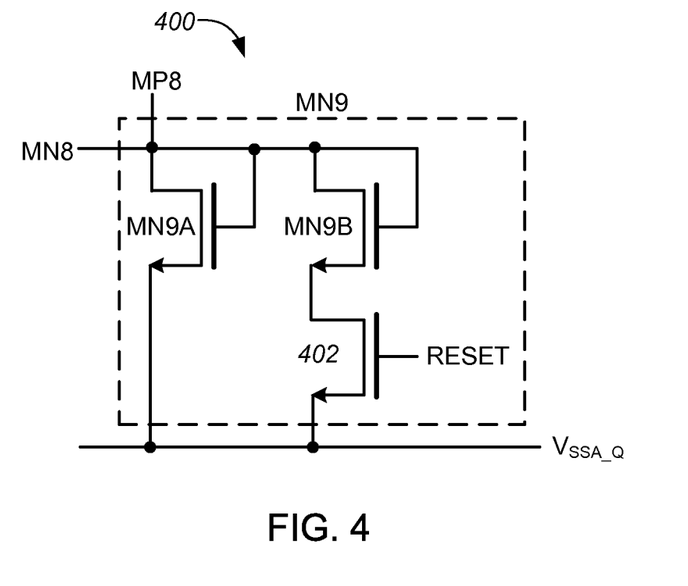
FIG. 4 is a schematic diagram of an embodiment of diode connected device MN9 of the integrating amplifier in FIG. 3.

In one embodiment, this is achieved by optioning in one more parallel diode connected devices with diode connected device (MN9) in an output stage current path, effectively increasing the width (channel width) of MN9. Generally, the width of MN9 is increased by at least about 100%, or from about 1000 nm to about 2000 nm. A detailed schematic diagram of one version of this embodiment is illustrated in FIG. 4. Referring to FIG. 4, MN9 may include two diode connected devices, MN9A and MN9B, connected in parallel between MP8 and MN8 and the negative supply voltage to the integrating amplifier ($V_{SSA\_Q}$), and a switching element 402. The switching element 402 is configured to open when the integrating amplifier is operated in an integration mode, decoupling one of the diode connected devices, MN9B, and to close in reset mode to increase the output stage current when the integrating amplifier is operated in RESET mode to provide greater stability.

In another embodiment, the output stage current can be increased by increasing the width of the output devices MP9 and MN10. In yet another embodiment, the output stage current can be increased by changing biasing of the integrating amplifier.

Figure 5:
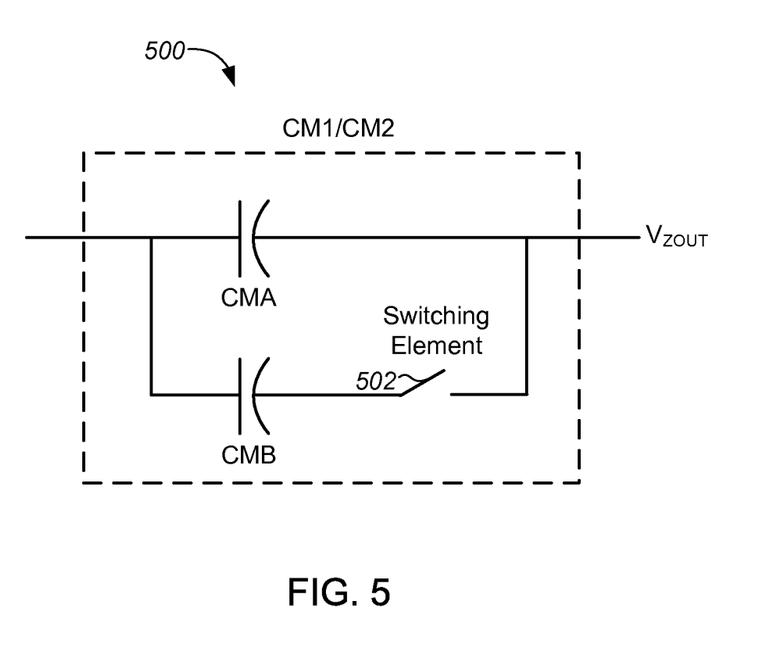
FIG. 5 is a schematic diagram of an embodiment of a compensating capacitor of the integrating amplifier in FIG. 3.

A detailed schematic diagram of a compensating capacitor (CM1/CM2) 500 in the integrating amplifier of FIG. 3 is illustrated in FIG. 5. Referring to FIG. 5, in one embodiment each of the compensating capacitors 500 may include two smaller capacitors, CMA and CMB, coupled in parallel and a switching element 502 configured to open when the integrating amplifier is operated in a RESET mode, decoupling one of the two smaller capacitors from the output ($V_{ZOUT}$) to decrease capacitance of the compensating capacitor 500. The switching element 502 can be controlled by the same or a contemporaneous reset signal used to close switch 206 in the Rx channel 200. In certain embodiments, the capacitances of the two smaller capacitors (CMA and CMB) are selected so that the capacitance of the compensating capacitor 500 is decreased by at least 10% when the integrating amplifier is operated in RESET mode. In one embodiment, the capacitances of the two smaller capacitors (CMA and CMB) are selected so the capacitance of the compensating capacitor 500 is decreased by about at least 50% in RESET mode, and in another embodiment by about 65%.

Figure 6:
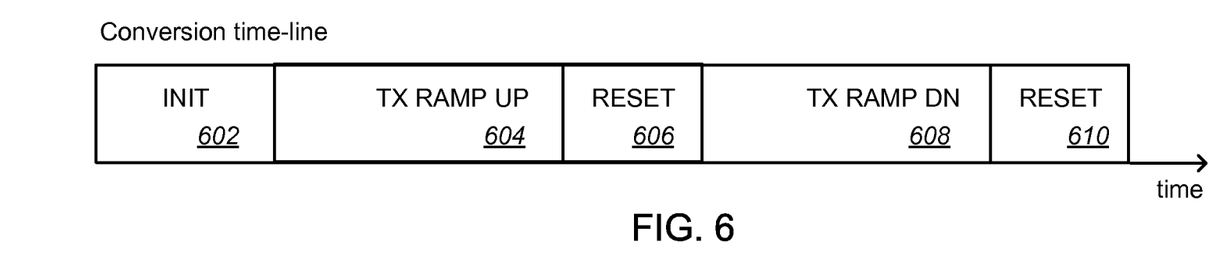
FIG. 6 is a time-line of a conversion illustrating modes of operation of the integrating amplifier illustrated in FIGS. 2 and 3.

Embodiments for the configuration of an Rx channel 700 of the capacitive sensing system will now be described with reference to FIGS. 6, 7A and 7B. Referring to FIG. 6, NIT 602 represents an initialization phase of an embodiment of an integrating amplifier 702 lasting from about 2000 nanoseconds (ns) to about 10000 ns, during which an output ($V_{ZOUT}$) is allowed to settle to a voltage of VREF, while having the integrator in reset mode.

Figure 7A:
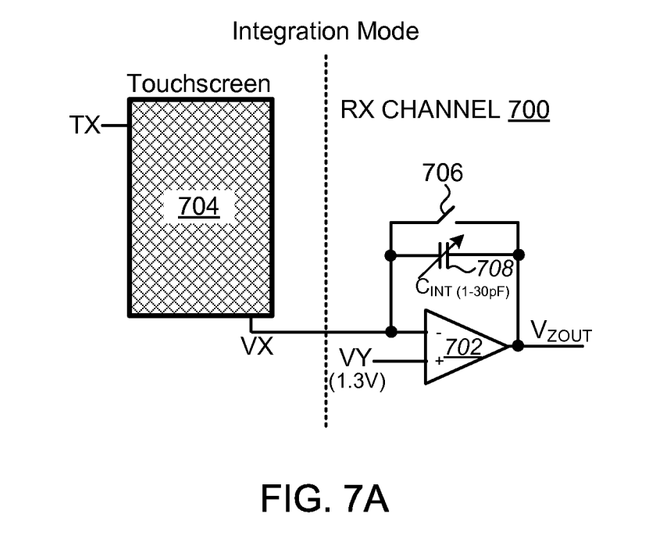
FIG. 7A is a simplified schematic block diagram illustrating an embodiment of operation of the integrating amplifier in Integration mode.

Referring to FIGS. 6 and 7A, TX_RAMP_UP 604, represents a first integration mode during which a rising edge voltage pulse (Tx) is applied sequentially to each of the transmit electrodes in the touchscreen 704 resulting in an accumulation of charge on the receive electrodes, according to one embodiment, which is sensed and measured by the Rx channel 700. The time or duration for the TX_RAMP_UP 604 is determined by parasitics of the touch screen 704, and generally lasts for about 800 ns. According to one embodiment, during the TX_RAMP_UP 604 switch 706 is opened enabling the integration capacitor 708 to accumulate charge from a sensor capacitor array (not shown in these figures) in the touchscreen 704 and to allow the current in the integrator to settle to about 95%.

The from VX node from touchscreen 704 may then be applied to an inverting input of the integrating amplifier 702, and compared to reference voltage (VY) applied to a non-inverting input. An exemplary reference voltage is about 1.3V. As the $C_{INT}$ 708 charges $V_{ZOUT}$ increases until the integrating amplifier 702 is driven into saturation or is reset.

Next, after a predetermined period of time, generally before the Tx voltage is removed or reversed, the Rx channel 700 is reset (RESET 606). As shown in the embodiment of FIG. 7B, during RESET mode switch 706 is closed resetting the integration capacitor 708 and placing the integrating amplifier 702 in a unity gain configuration. As noted above, during RESET capacitance of compensating capacitors (e.g., compensating capacitors (CM1/CM2) 500 of FIG. 5) in the integrating amplifier 702 is decreased, thereby increasing the slew rate and substantially reducing the time the Rx channel must remain in RESET mode. The time or duration for RESET 606 is determined by a current budget, parasitics of the touch screen 704 and the process technology used to fabricate the integrating amplifier 702. According to one embodiment, the RESET 606 lasts for less than or equal to about 200 ns.

TX_RAMP_DN 608, represents a second integration mode during which, according to one embodiment, a falling edge voltage pulse (Tx) is applied sequentially to each of the transmit electrodes in the touchscreen 704 resulting in an accumulation of charge on the receive electrodes, which is sensed and measured by the Rx channel 700. As with TX_RAMP_UP 704, the time or duration for TX_RAMP_DN 608 is determined by parasitics of the touch screen 704. According to one embodiment, TX_RAMP_DN 608 may last about 800 ns, during which switch 706 is opened enabling the integration capacitor 708 to accumulate charge from the sensor capacitor array in the touchscreen 704.

Finally, after another predetermined period of time, which in one embodiment, may be the same as for TX_RAMP_UP 604, the Rx channel 700 is reset (RESET 610). As shown in FIG. 7B and described above, during RESET 610 switch 706 is closed resetting the integration capacitor 608 and placing the integrating amplifier 702 in a unity gain configuration, and the capacitance of compensating capacitors in the integrating amplifier 702 is decreased. As with RESET 606, the time or duration for RESET 610 is determined by current budget, parasitics of the touch screen 704 and the process technology used to fabricate the integrating amplifier 702, and according to one embodiment may last for less than or equal to about 200 ns.

Figure 7B:
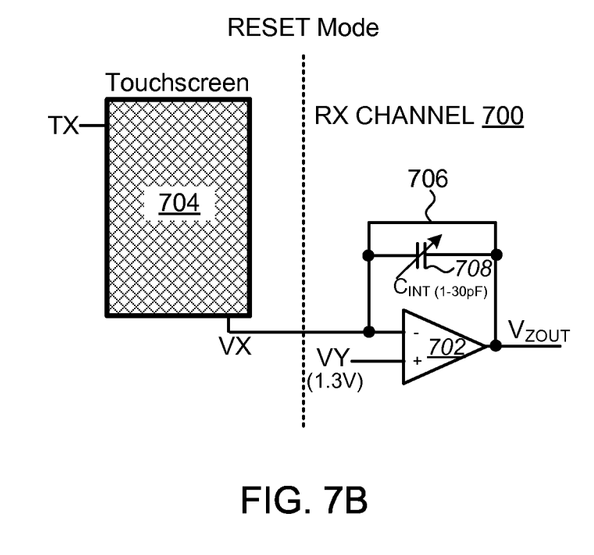
FIG. 7B is a simplified schematic block diagram illustrating an embodiment of operation of the integrating amplifier in RESET mode.
Figure 8:
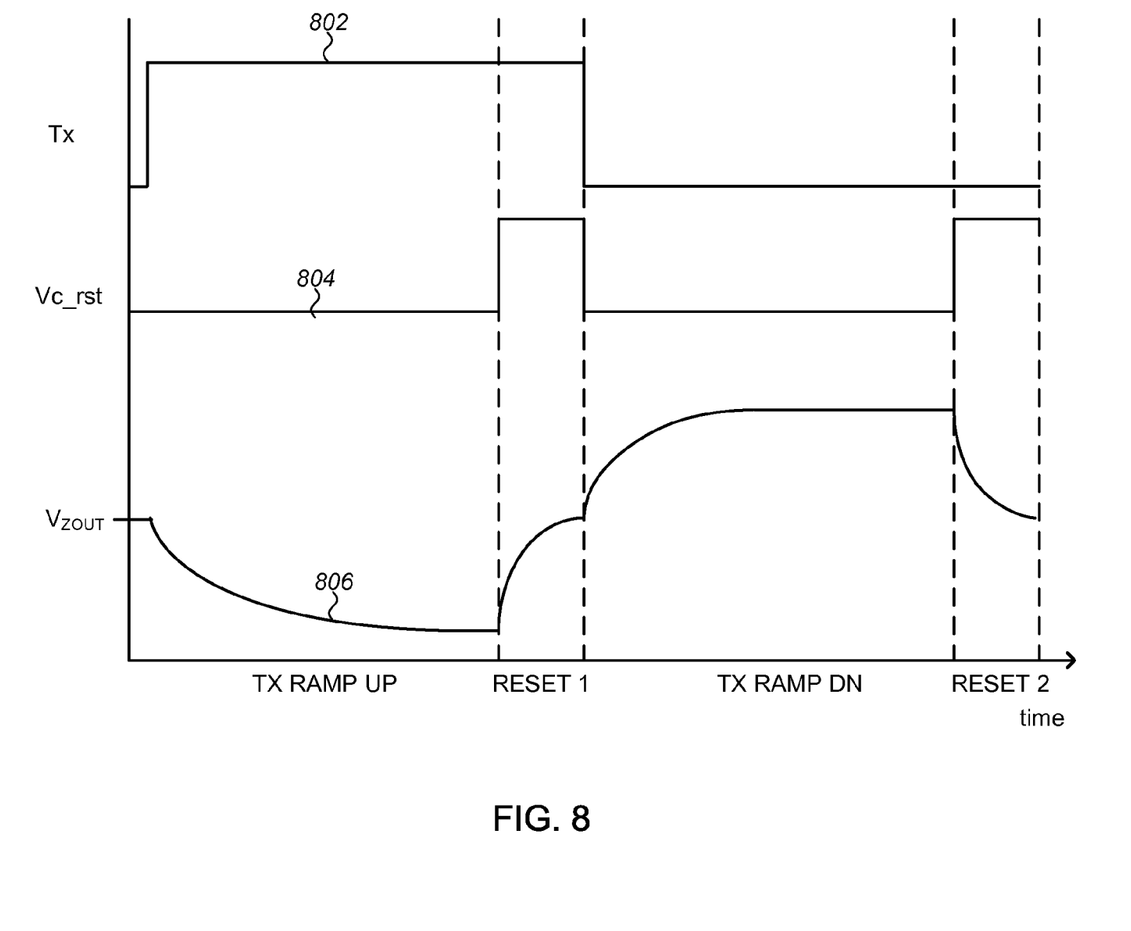
FIG. 8 are plots of some waveforms of the operation of the circuit in FIGS. 7A and 7B.

FIG. 8 shows plots of some waveforms of the operation of an embodiment of the circuit in FIGS. 6, 7A and 7B. The graph or line labeled 802 represents the voltage pulse (Tx) applied to the transmit electrodes. Line 804 represents a reset signal (Vc_rst) applied to the switch 706 to close the switch during RESET mode and to the integrating amplifier 702 to decrease capacitance of compensating capacitors. Line 806 represents $V_{ZOUT}$ during both RESET mode and integration mode. Referring to FIG. 8, it is noted that during a first time, identified on the horizontal axis as TX RAMP UP, the integrating amplifier 702 is in integration mode with a rising edge voltage pulse (Tx) applied to the transmit electrodes of the touch screen 704, while the reset signal (Vc_rst) is de-asserted or not applied to switch 706. As the $C_{INT}$ 708 charges $V_{ZOUT}$ decreases until the integrating amplifier 702 is driven into saturation. During a second time, identified on the horizontal axis as RESET 1, the reset signal (Vc_rst 804) is asserted closing switch 706, resetting $C_{INT}$ 708 and decreasing the capacitance of compensating capacitors in the integrating amplifier 702. It is noted the high slew rate of the integrating amplifier 702 enables an extremely fast reset during which $V_{ZOUT}$ 806 returns rapidly to an initial value. Finally, after the first reset (RESET 1), TX RAMP DN, the reset signal (Vc_rst) is de-asserted, the integrating amplifier 702 is again operated in integration mode and a falling edge voltage pulse (Tx) is applied to the transmit electrodes of the touch screen 704. As the $C_{INT}$ 708 charges $V_{ZOUT}$ increases until the integrating amplifier 702 is driven into saturation.

Figure 9:
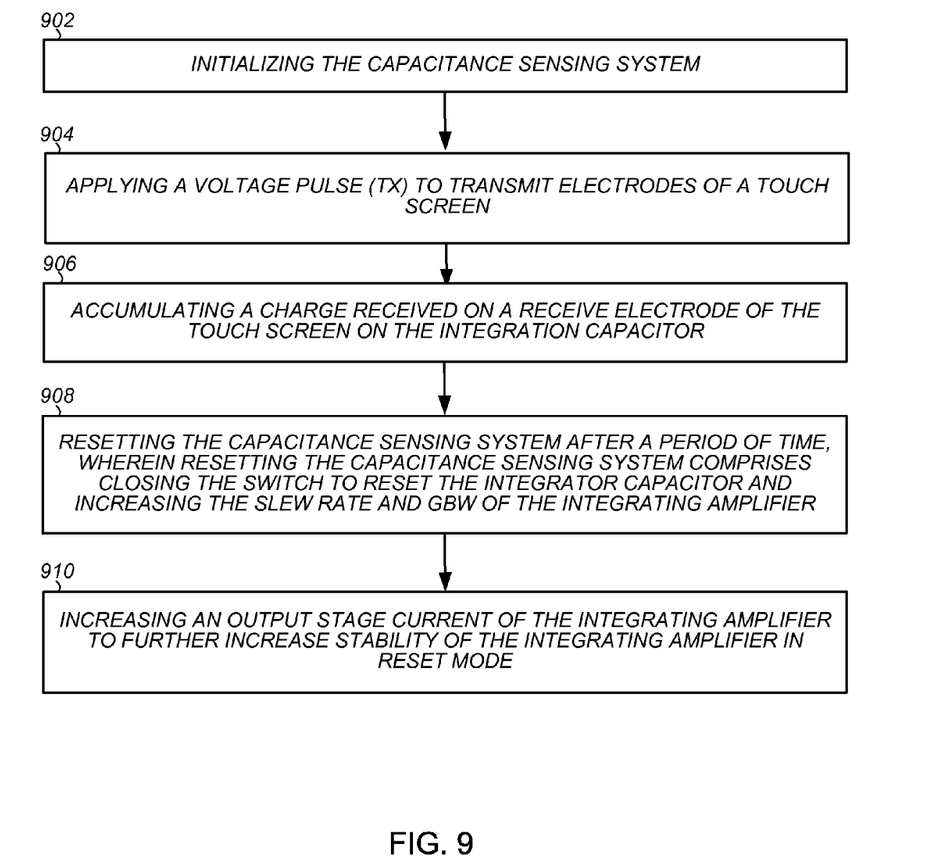
FIG. 9 is a flow chart of an embodiment of a method for operating a capacitance sensing system including an integrating amplifier to provide a higher slew rate and bandwidth.

An embodiment of a method for operating a capacitance sensing system including an integrating amplifier to provide a higher slew rate and bandwidth will now be described with reference to the flow chart of FIG. 9. Referring to FIG. 9, the method begins with initializing the capacitance sensing system (902) during which an output ($V_{ZOUT}$) of the integrating amplifier is allowed to settled to a voltage of VREF by programming the integrating amplifier in reset mode. After initialization, a voltage pulse (Tx) may then be applied to the transmit electrodes of the touch screen (904). Next, a charge received on a receive electrode of the touch screen is accumulated on the integration capacitor (906). The capacitance sensing system is reset after a period of time, wherein resetting the capacitance sensing system comprises closing the switch to reset the integrator capacitor and increasing the slew rate and gain-bandwidth (GBW) of the integrating amplifier (908). In some embodiments, such as those described above, increasing the slew rate and gain-bandwidth (GBW) of the integrating amplifier is accomplished by decreasing capacitance of the compensating capacitor while the integrating amplifier is operated in a RESET mode. Resetting the capacitance sensing system may further include increasing an output stage current of the integrating amplifier to further increase stability of the integrating amplifier in RESET mode (910).

Thus, embodiments of an integrating amplifier and methods for operating the same to sense capacitance in a touch-screen while providing enhanced slew rate and bandwidth in RESET mode have been described. Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment. The term to couple as used herein may include both to directly electrically connect two or more components or elements and to indirectly connect through one or more intervening components.

What is claimed is:

1. An integrating amplifier comprising:
an input stage including an inverting input coupled to an electrode of a sense capacitor to sense a capacitance thereof and a non-inverting input coupled to a reference potential; and
an output stage including a compensating capacitor coupled to an output, the compensating capacitor comprising two smaller capacitors coupled in parallel and a switching element configured to open when the integrating amplifier is operated in a RESET mode decoupling one of the two smaller capacitors from the output to decrease capacitance of the compensating capacitor when the integrating amplifier is operated in RESET mode, and to close when the integrating amplifier is operated in an INTEGRATION mode.

2. The integrating amplifier of claim 1, further comprising a plurality of diode connected devices coupled in parallel when the integrating amplifier is operated in RESET mode to provide greater stability.

3. The integrating amplifier of claim 2, wherein the plurality of diode connected devices comprises parallel diode connected devices, and wherein one of the parallel diode connected devices is switched into an output stage current path when the integrating amplifier is operated in RESET mode to provide greater stability.

4. The integrating amplifier of claim 1, further comprising an integration capacitor and switch coupled in parallel between the inverting input of the integrating amplifier and the output, wherein the switch is opened when the integrating amplifier is operated in an integration mode to accumulate charge from the sense capacitor, and closed during RESET mode to reset the integration capacitor.

5. The integrating amplifier of claim 1, wherein the two smaller capacitors of the compensating capacitor comprise capacitances selected so that the capacitance of the compensating capacitor is decreased by at least 10% when the integrating amplifier is operated in RESET mode.

6. The integrating amplifier of claim 1, wherein the two smaller capacitors of the compensating capacitor comprise capacitances selected so that the capacitance of the compensating capacitor is decreased by about 50% when the integrating amplifier is operated in RESET mode.

7. A capacitance sensing system comprising:

an integrating amplifier including an input stage including an inverting input coupled to an electrode of a sense capacitor to be sensed and a non-inverting input coupled to a reference voltage, and an output stage including a compensating capacitor coupled to an output;

an integration capacitor coupled between the inverting input of the integrating amplifier and the output to accumulate charge from the sense capacitor when the integrating amplifier is operated in an integration mode; and a switch coupled in parallel with the integration capacitor between the inverting input of the integrating amplifier and the output, the switch configured to be open in integration mode and closed when the integrating amplifier is operated in RESET mode to reset the capacitor, wherein the integrating amplifier further comprises a device plurality of diode connected devices coupled in parallel to increase an output stage current when the integrating amplifier is operated in RESET mode.

8. The capacitance sensing system of claim 7, wherein the plurality of diode connected devices comprises parallel diode connected devices, and wherein one of the parallel diode connected devices is switched into an output stage current path when the integrating amplifier is operated in RESET mode to provide greater stability.

9. The capacitance sensing system of claim 7, wherein the compensating capacitor comprises two smaller capacitors coupled in parallel and a switching element configured to open when the integrating amplifier is operated in a RESET mode decoupling one of the two smaller capacitors from the output to decrease capacitance of the compensating capacitor when the integrating amplifier is operated in RESET mode.

10. The capacitance sensing system of claim 9, wherein the two smaller capacitors of the compensating capacitor comprise capacitances selected so that the capacitance of the compensating capacitor is decreased by at least 10% when the integrating amplifier is operated in RESET mode.

11. The capacitance sensing system 9, wherein the two smaller capacitors of the compensating capacitor comprise capacitances selected so that the capacitance of the compensating capacitor is decreased by about 50% when the integrating amplifier is operated in RESET mode.

12. A method for sensing capacitance of a capacitor, comprising:

accumulating a charge received on a receive electrode of a sense capacitor using a capacitance sensing system including an integrating amplifier comprising an input stage including an inverting input coupled to the receive electrode, and an output stage including a compensating capacitor coupled to an output; and resetting the capacitance sensing system after a period of time, wherein resetting the capacitance sensing system comprises increasing the slew rate and gain-bandwidth (GBW) of the integrating amplifier.

13. The method of claim 12, wherein increasing the slew rate and GBW of the integrating amplifier comprises decreasing capacitance of the compensating capacitor while the integrating amplifier is operated in a RESET mode.

14. The method of claim 13, wherein the compensating capacitor comprises two smaller capacitors coupled in parallel and a switching element configured to open when the integrating amplifier is operated in RESET mode, and wherein decreasing capacitance of the compensating capacitor comprises opening the switching element to decouple one of the two smaller capacitors from the output to decrease capacitance of the compensating capacitor.

15. The method of claim 13, wherein decreasing capacitance of the compensating capacitor while the integrating amplifier is operated in a RESET mode comprises decreasing capacitance of the compensating capacitor by about 50%.

16. The method of claim 12, wherein the capacitance sensing system further comprises an integration capacitor and switch coupled in parallel between the inverting input of the integrating amplifier and the output, and wherein resetting the capacitance sensing system further comprises closing the switch to reset the integration capacitor.

17. The method of claim 12, wherein resetting the capacitance sensing system further comprises increasing an output stage current of the integrating amplifier to provide greater stability.

18. The method of claim 17, wherein the capacitance sensing system further comprises a first diode connected device, and wherein increasing an output stage current of the integrating amplifier comprises enabling a second diode connected device in parallel with the first first diode connected device when the integrating amplifier is operated in RESET mode.

19. The method of claim 12, wherein resetting the capacitance sensing system does not comprise decoupling the receive electrode from the capacitance sensing system.

20. The integrating amplifier of claim 1, wherein the switching element is configured to open only when the integrating amplifier is operated in a RESET mode.

* * * * *